United States Patent [19]
Rinderer

[11] Patent Number: 5,819,956
[45] Date of Patent: Oct. 13, 1998

[54] RACK FOR ELECTRICAL EQUIPMENT

[75] Inventor: Eric R. Rinderer, Highland, Ill.

[73] Assignee: Sigma-Aldrich Company, St. Louis, Mo.

[21] Appl. No.: 806,055

[22] Filed: Feb. 25, 1997

[51] Int. Cl.$^6$ .................................................. A47F 5/00
[52] U.S. Cl. ............................ 211/26; 211/189; 361/829
[58] Field of Search ........................... 211/26, 182, 189;
312/265.1, 265.4; 361/829, 825, 819, 796;
108/108, 109

[56] References Cited

U.S. PATENT DOCUMENTS

| | | | |
|---|---|---|---|
| 1,516,711 | 11/1924 | Christell . | |
| 1,957,362 | 5/1934 | Smith | 304/5 |
| 2,058,263 | 10/1936 | Rosendale | 312/143 |
| 2,114,155 | 4/1938 | Streich | 189/86 |
| 2,386,019 | 10/1945 | Watter | 189/36 |
| 2,875,902 | 3/1959 | Ayars, Jr. | 211/13 |
| 2,950,786 | 8/1960 | Markle | 189/1 |
| 3,265,419 | 8/1966 | Durnbaugh et al. | 287/189.36 |
| 3,297,383 | 1/1967 | Fay | 312/257 |
| 3,537,221 | 11/1970 | Helfman et al. | 52/289 |
| 3,598,066 | 8/1971 | Polezoes | 108/108 X |
| 3,640,389 | 2/1972 | Snyder | 108/108 X |
| 3,907,445 | 9/1975 | Wendt | 403/232 |
| 3,989,398 | 11/1976 | Wendt | 403/232 |
| 4,410,294 | 10/1983 | Gilb et al. | 403/27 |
| 4,422,792 | 12/1983 | Gilb | 403/232.1 |
| 4,497,411 | 2/1985 | DeBortoli | 211/26 |
| 4,553,674 | 11/1985 | Yoshikawa et al. | 211/26 |
| 4,572,695 | 2/1986 | Gilb | 403/232.1 |
| 4,594,017 | 6/1986 | Hills | 403/6 |
| 4,641,987 | 2/1987 | Schlegel | 403/169 |
| 4,690,286 | 9/1987 | Horne et al. | 211/42 |
| 4,715,502 | 12/1987 | Salmon | 211/26 |
| 4,732,281 | 3/1988 | Hall, II, et al. | 211/26 |
| 5,004,107 | 4/1991 | Sevier et al. | 211/26 |
| 5,228,762 | 7/1993 | Mascrier | 312/265.4 |
| 5,233,129 | 8/1993 | Hall | 174/52.1 |
| 5,284,254 | 2/1994 | Rinderer | 211/26 |
| 5,566,836 | 10/1996 | Lerman | 211/26 |
| 5,683,001 | 11/1997 | Masuda et al. | 211/26 |

FOREIGN PATENT DOCUMENTS

| | | | |
|---|---|---|---|
| 19881 | 2/1965 | Japan | 211/26 |
| 815777 | 7/1959 | United Kingdom | 211/26 |
| 983471 | 2/1965 | United Kingdom | 403/282 |

OTHER PUBLICATIONS

Lincoln Electric, "How Welding Simplifies the Design of Brackets", Product Engineering, Nov. 1948.
Hendry Telephone Products, "Relay Racks", pp. 12, 13 & 55, published at least as early as Jul., 1990.
Hendry Telephone Products, "Relay Racks", Sep., 1988.
Magnetic Controls Co., "Rack, 19" Relay, 2 Mounting, Oct., 1982.
Magentic Controls Co., "Rack Junctions", Sep. 8, 1981.
Unequal Flange Rack, Mar. 11, 1975, ITT Telecommunications, (author unknown).
Cable–Duct Relay Rack, Dec. 8, 1982, Rockwell International Corp. (author unknown).

*Primary Examiner*—Robert W. Gibson, Jr.
*Attorney, Agent, or Firm*—Senniger, Powers, Leavitt & Roedel

[57] ABSTRACT

A rack for electrical equipment is constructed for resistance to failure in earthquake conditions. The rack has a base and two legs extending upwardly from the base. A cross member spans between and interconnects the legs near their tops. A reinforcing strut on either the front or back flange of each leg forms, in combination with the flange a box beam element which greatly strengthens the flange of the leg. A brace attached to the underside of the cross member passes through an opening in the web of the leg and is rigidly attached to the reinforcing strut. The arrangement of the brace facilitates the mounting of EMI shielding on the rack. The rack also has a one-piece cover for closing the base of the rack.

39 Claims, 6 Drawing Sheets

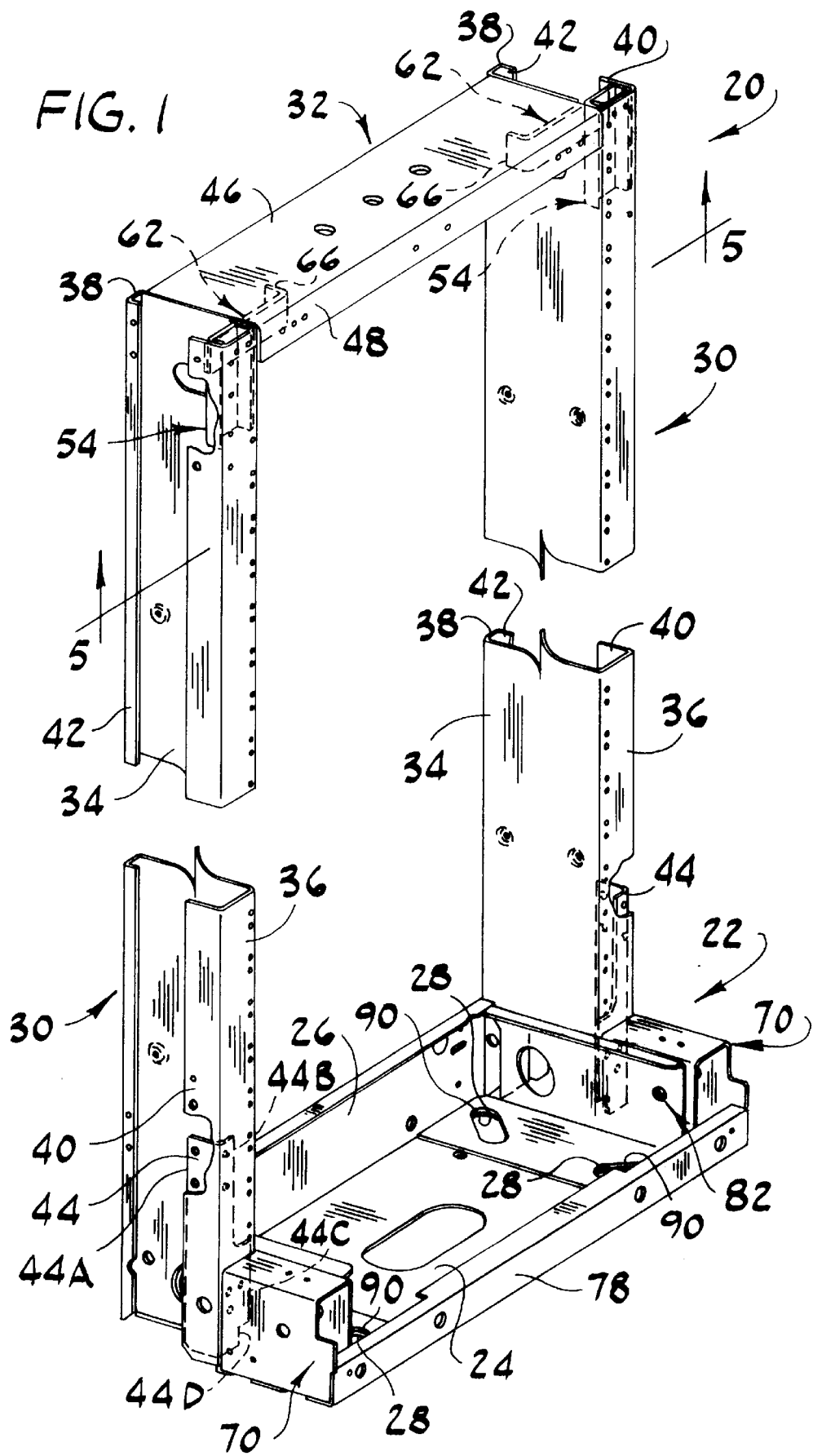

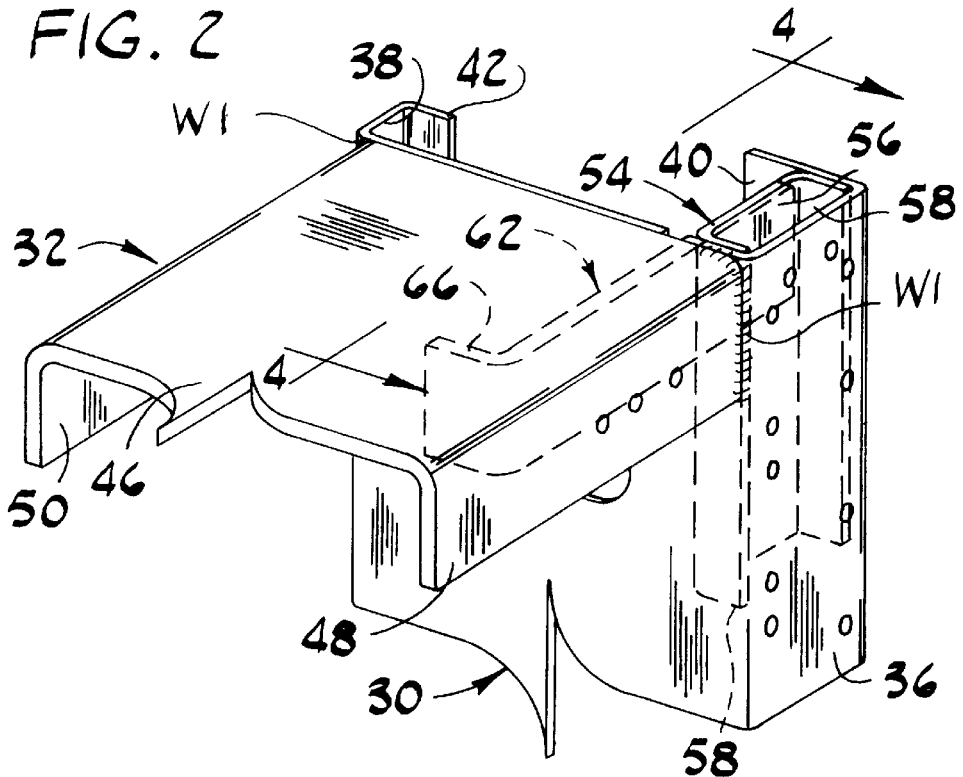
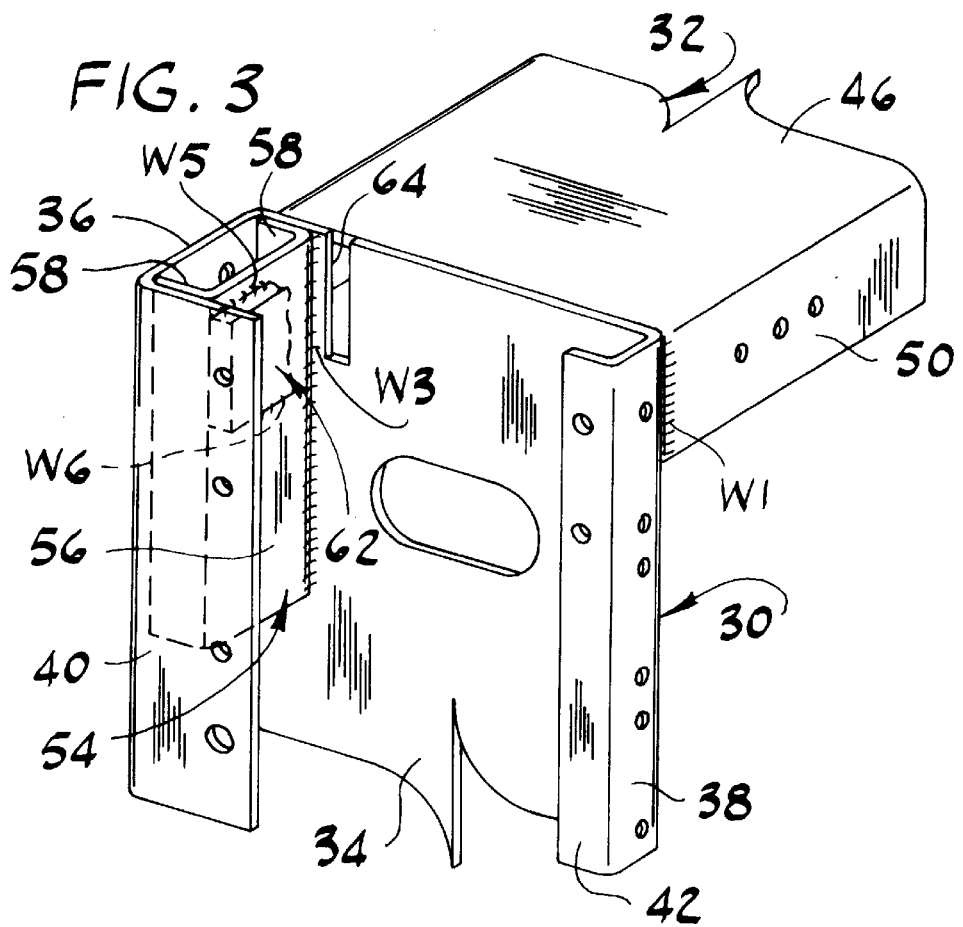

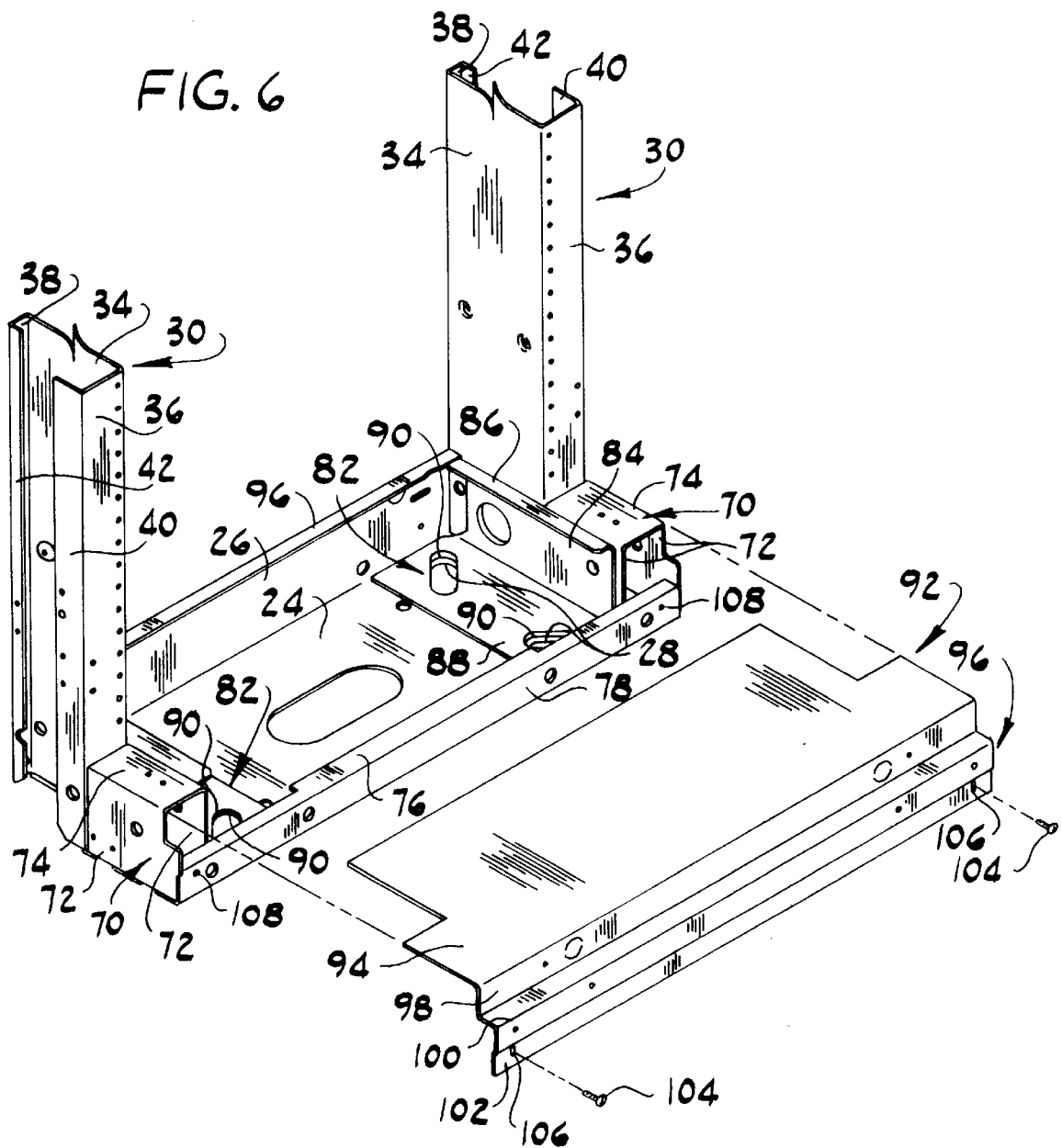

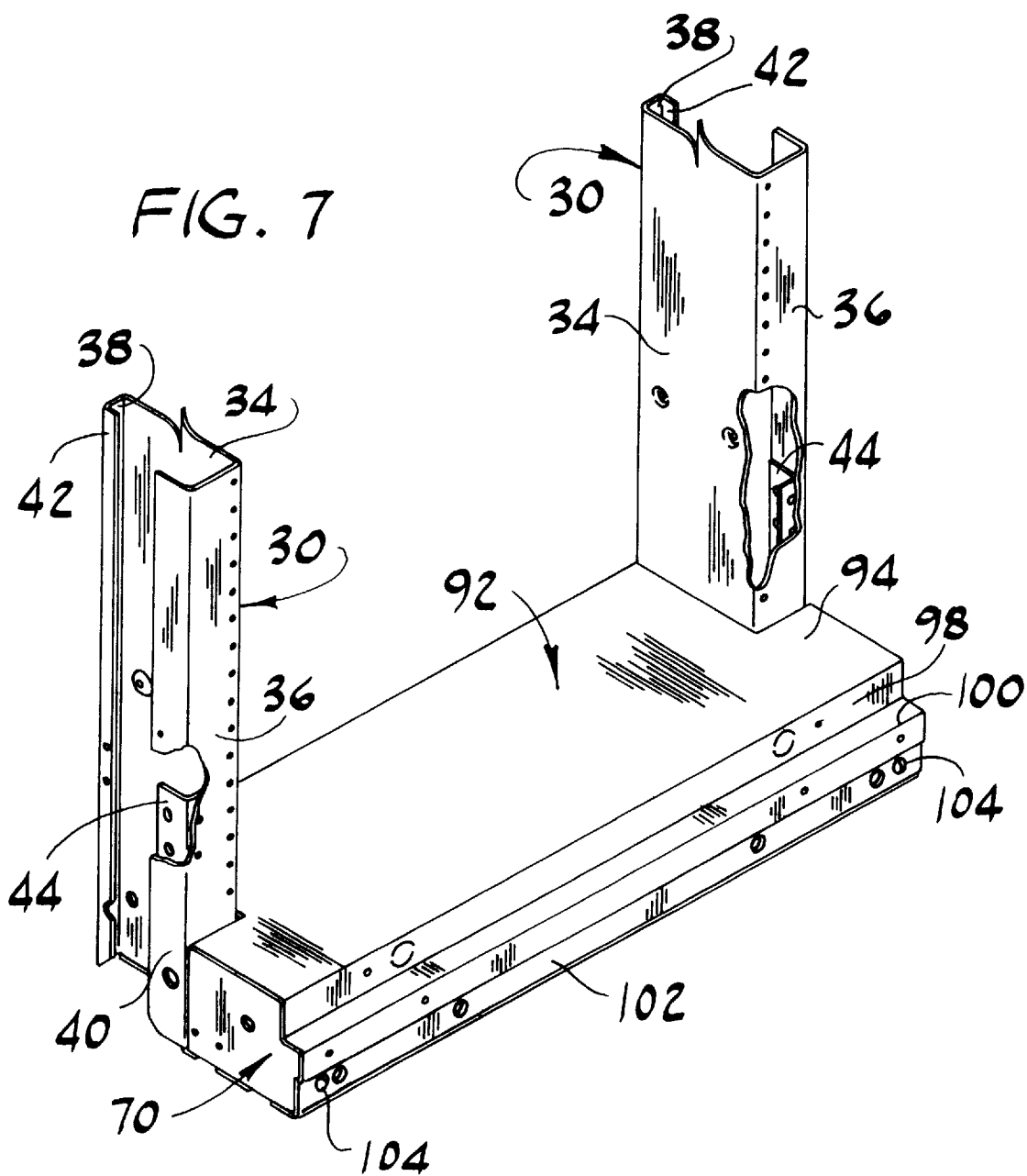

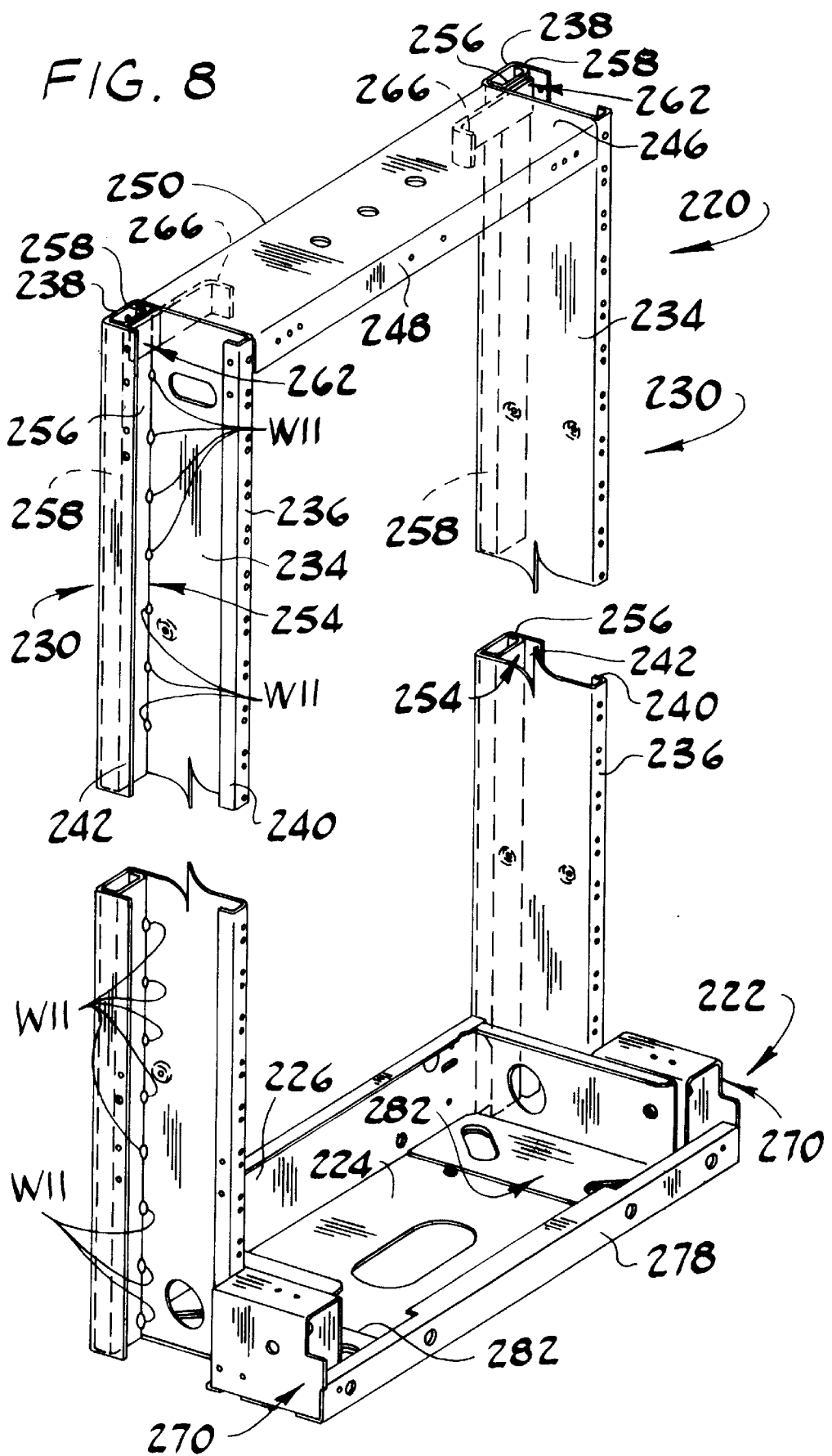

RACK FOR ELECTRICAL EQUIPMENT

BACKGROUND OF THE INVENTION

This invention relates generally to racks and, more particularly, to a rack for electric equipment.

The present invention is related to the rack disclosed in co-assigned U.S. Pat. No. 5,284,254, which is incorporated herein by reference. A common use of racks of the type to which the present invention relates is for carrying telephone circuitry in a building. The rack has a base and two legs extending upwardly from the base. To strengthen the structure, the legs are also connected together by a cross member near the top of the legs. The legs and the cross member are each channel-shaped, having a web and two opposing flanges. The base and the space between the legs is sometimes closed by a cover and panels, respectively, to shield the circuitry from EMI (or to protect the circuitry from EMI). Typically, each rack carries up to 400–500 pounds of electrical equipment, and is bolted or otherwise secured to the floor. In certain geographic areas where there is a high risk of seismic activity, it is necessary to provide additional reinforcement to prevent the racks from failing during an earthquake.

In U.S. Pat. No. 5,284,254, structure for reinforcing the base of the rack was disclosed. However, when the rack is subjected to vibratory motion as occurs during an earthquake, the long legs of the rack tend to whip violently from side to side subjecting the weld connection of the cross member to the webs of the legs to tremendous stress. Failure of the connection of the cross member to either one of the legs rapidly leads to catastrophic failure of the rack. It is known to provide longitudinal extensions of the front and back flanges of the cross member to overlie either the front or back face of the corresponding front and back flanges of the legs. The extensions are welded to the flange they overlie. However, the stresses encountered in an earthquake can cause the flange to fail. Often the flanges of the legs are effectively made thicker by welding an additional piece of metal on the flanges. However, the flanges are still subject to bending out of their plane by the stresses applied when the legs move from side to side.

If extensions of the front and back flanges of the cross member are welded to exterior faces of the front and back flanges of the legs, the front and back flanges of the cross member will not be flush with the front and back flanges of the legs. It is difficult to attach panels to the legs to enclose the space between the legs when the cross member protrudes forwardly and rearwardly from the legs. Even a small space between the legs and the panel will permit EMI to leak into (or out of) the space between the legs. It is possible to bend the cross member extensions so that they may extend through the webs of the legs and into contact with the rear faces of the front and back flanges. This permits the cross member to be flush with the front and back flanges of the legs. However, the forming of the bent extensions increases manufacturing complexity and cost.

It is sometimes necessary to access the electrical wiring in the rack. Accordingly, the panels on the legs and/or the cover on the base must be removed to permit the needed access. In the usual circumstance, the racks are located close together in a room in a building, and there is very little space for a technician to work on any given rack. Frequently, the panels are readily removed from the legs. However, the cover for the base is in two pieces and requires the removal of several fasteners to release the cover from base. Alternatively, only a portion of the cover may be removable, which severely restricts access to the base.

SUMMARY OF THE INVENTION

Among the several objects and features of the present invention may be noted the provision of a rack which resists failure in earthquake conditions; the provision of such a rack which withstands and resists whipping action of the legs in earthquake conditions; the provision of such a rack which can be tightly sealed by panels for EMI shielding; the provision of such a rack which has easy access to electrical equipment and the like in its base in cramped quarters; the provision of such a rack which permits access to the full interior of the base; the provision of such a rack which is readily manufactured.

Generally, a rack for electrical equipment of the present invention comprises a base having a front, a back and opposite sides, and a pair of legs extending up from the base at opposite sides of the base. Each leg is generally channel-shaped and has a web, a front flange projecting from a front edge of the web and a back flange projecting from a back edge of the web. A cross member extending between the webs of the legs generally at the upper ends of the legs is rigidly connected to each leg to interconnect the legs for strengthening the rack. Reinforcing struts rigidly mounted on each leg each have a web in spaced apart opposed relation with an interior face of one of the front and back flanges of the leg. Said one flange and the reinforcing strut define a box beam element strengthening said one flange. Tie means rigidly interconnects the cross member to the box beam element.

In another aspect of the present invention, a rack generally comprises a base, legs and a cross member, as set forth above. A brace for each leg rigidly interconnecting the cross member to each leg has two thin edges and opposed broad sides. One of the thin edges engages the web of the cross member. The brace extends through an opening in the leg web generally transversely over one of the front and back flanges of the leg and is rigidly connected to the leg. The brace includes a first portion in generally closely spaced, parallel relation to one of the front and back flanges of the cross member and a second portion in generally non-parallel arrangement to said one flange of the cross member. The brace is butt welded to the web of the cross member along an upper edge of a side of the first portion facing away from said one flange of the cross member, and along the second portion.

In yet another aspect of the present invention, a rack generally comprises a base, legs, cross member and tie means as set forth above. A one-piece cover is adapted to be removably fastened to the base of the rack in a position where the cover extends forward from the back wall of the base between the legs of the rack and is spaced above the bottom wall of the base to form, in combination with the back and bottom walls of the base, an enclosure. Fasteners for removably fastening the cover in fixed position on the base are adapted to be unfastened for removing the cover from the base thereby to provide ready access to an interior of the base.

Other objects and features of the invention will be in part apparent and in part pointed out hereinafter.

BRIEF DESCRIPTION OF THE DRAWINGS

FIG. 1 is a perspective view of a rack of the present invention with portions of legs of the rack broken away;

FIG. 2 is an enlarged fragmentary perspective of the upper right hand corner of the rack of FIG. 1 illustrating the connection of a cross member to a right leg of the rack;

FIG. 3 is a rear perspective of the upper right hand corner of the rack of FIG. 2 with a brace broken away to reveal an opening in the right leg through which the brace extends;

FIG. 6 is a fragmentary perspective of the rack with a cover of the rack exploded from its base;

FIG. 7 is a fragmentary perspective of the rack illustrating the base having a cover thereon; and FIG. 8 is a fragmentary front perspective of a rack of a second embodiment.

Corresponding reference characters indicate corresponding parts throughout the several views of the drawings.

DETAILED DESCRIPTION OF THE PREFERRED EMBODIMENTS

Figure 4:
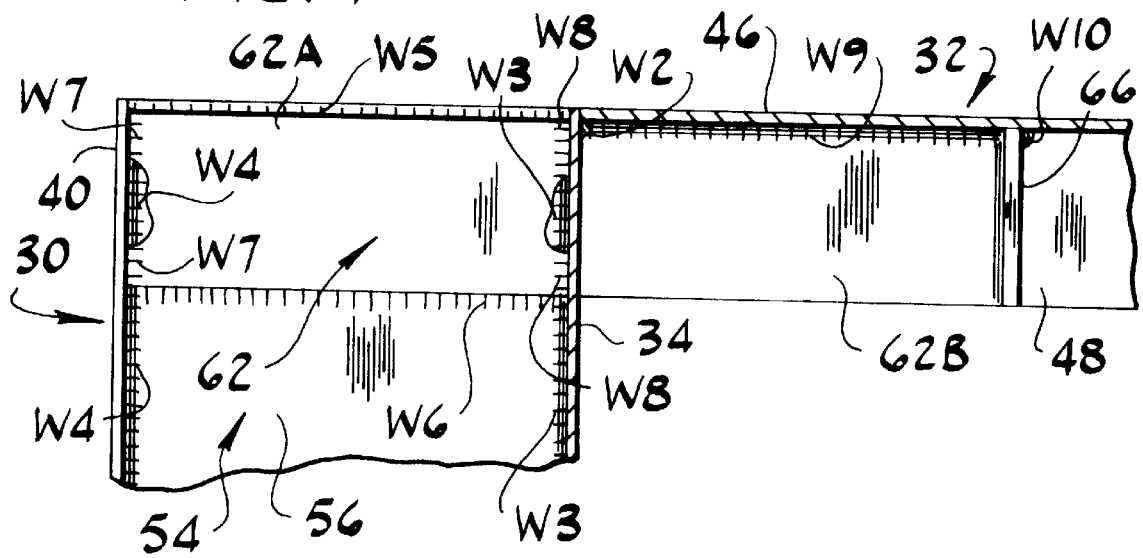
FIG. 4 is a section taken in the plane including line 4—4 of FIG. 2.

Referring now to the drawings, and in particular to FIG. 1, a rack constructed according to the principles of the present invention is indicated generally at 20. The rack, which is particularly adapted for mounting electrical equipment (e.g., telephone relay circuits), includes a base, generally indicated at 22, having a front, a back, opposite sides, a bottom wall 24 and a back wall 26 extending up from the bottom wall generally at the back of the base. A plurality of fastener openings 28 in the bottom wall 24 may have fasteners (not shown) driven through them and into a surface (not shown) supporting the rack 20 for securing the rack to the surface. The fastener openings 28 are elongated, which permits flexibility in the positioning of the fasteners along the length of the openings. A pair of channel-shaped legs, generally indicated at 30, extend up from the bottom wall 24 of the base 22 at opposite sides of the rack 20 adjacent the back wall 26 of the base. The legs 30 are affixed to the bottom wall 24 of the base such as by welding to the bottom wall 24 and the back wall 26. A cross member, generally indicated at 32, spans between and interconnects the legs 30 at the tops of the legs.

Figure 5:
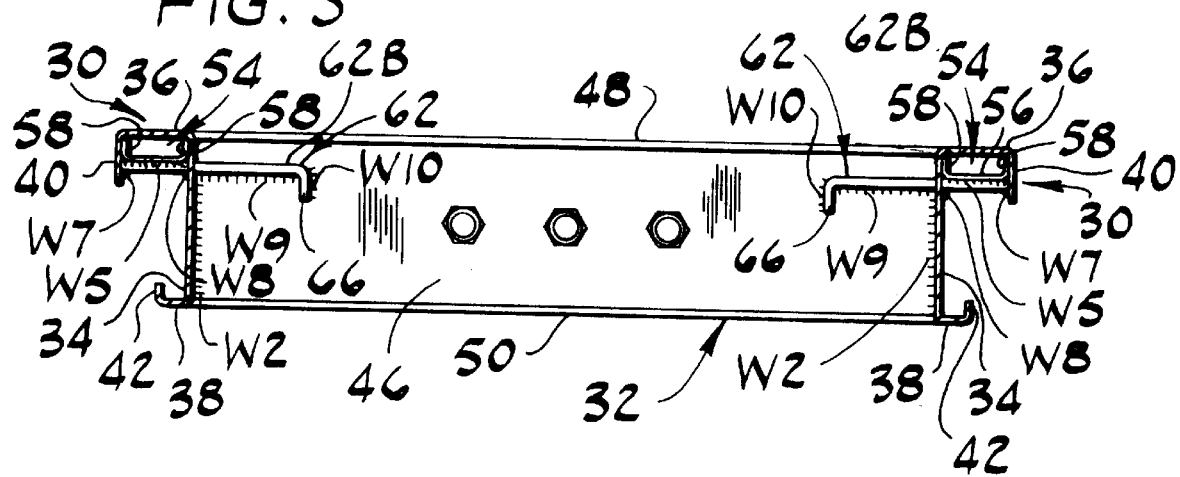
FIG. 5 is a section taken in the plane including line 5—5 FIG. 1.

The legs 30 each have a web 34, a front flange 36 projecting from a front edge of the web and a back flange 38 projecting from a back edge of the web. A front return flap 40 extends rearwardly from a laterally outer edge of the front flange 36 opposite the web 34. A shorter rear return flap 42 extends forwardly from a laterally outer edge of the back flange 38 opposite the web 34. A stiffener 44 on each leg 30 is attached by welding along the full length of vertical edge 44A to the return flap 40, and along vertical edges 44B, 44C to the front flange 36. The horizontally extending edges of the stiffener 44, and lower vertical edge 44D are free of welding. The cross member 32 includes a web 46, a front flange 48 depending from a forward edge of the web and a back flange 50 (see FIG. 2) depending from a rearward edge of the web. The front flange 48 of the cross member is substantially co-planar with the front flange 36 of the leg 30, and the back flange 50 of the cross member is substantially co-planar with the back flange 38 of the leg. The ends of the cross member front and back flanges 48, 50 and an adjacent portion of the cross member web 46 abutting the web 34 of the leg, are attached by weld lines W1 to the web of the leg. The web 46 of the cross member 32 is also attached by weld W2 on the underside of the cross member web to the web 34 of the leg (FIG. 5).

Referring now also to FIGS. 2–4, a reinforcing strut rigidly mounted on each leg 30 is generally indicated at 54.

The reinforcing strut has a web 56 in spaced apart opposed relation with an interior face of the front flange 36 of the leg. In the preferred embodiment, the reinforcing strut 54 has a pair of opposed flanges 58 extending forwardly from opposite longitudinal edges of the web 56 and into engagement with the interior face of the front flange 36 of the leg. The reinforcing strut 54 is fixed to the leg 30 by weld lines W3 and W4 extending along the longitudinal edges of the web 56 and joining the strut to the web 34 of the leg and the front return flap 44, respectively (FIG. 4). The weld lines W3, W4 are continuous and extend substantially the full length of the reinforcing strut 54. As attached to the leg 30, the reinforcing strut 54 and front flange 36 of the leg define a box beam element to strengthen the front flange. The reinforcing strut 54 reinforces the front flange 36 of the leg to resist forces, such as those forces encountered by the rack 20 during an earthquake, which tend to twist the material of the front flange about an axis perpendicular to the front flange and cause it to buckle and fail. The forces are encountered by the front flange 36 because the cross member 32 is tied to the front flange, as will be described below. It has been found in shake tests that catastrophic failure of the rack 20 occurs almost instantaneously upon failure of the connection of the cross member 32 to one of the legs 30.

In the preferred embodiment, the cross member 32 is tied to each of the legs 30 by a brace generally indicated at 62. The brace is rigidly connected to the cross member 32 and to the box beam element defined by the reinforcing strut 54 and front flange 36 of the leg. The brace 62 is generally L-shaped and has thin edges and broad sides. One of the thin edges engages the underside of the cross member web 46. The brace 62 extends from under the cross member web through an opening 64 in the web 34 of the leg and across the web 56 of the reinforcing strut 54. A part 62A of the brace 62 lies generally in face-to-face engagement with the web 56 of the reinforcing strut 54. As shown in FIG. 4, the brace 62 is attached to the reinforcing strut 54 by welds W5, W6 extending across upper and lower edge segments (respectively) of the part 62A overlying the reinforcing strut. The brace 62 is attached along the full length of its outer end by a weld W7 to the front return flap 44, and to the leg web 34 by a weld W8 extending transversely across the brace. The brace 62 is broken away in two places in FIG. 4 to show that the brace overlies portions of the continuous weld lines W3, W4 connecting the reinforcing strut 54 to the leg 30, and that the welds W7, W8 connecting the brace to the leg are in registration with but separate from the weld lines W3, W4.

A first portion 62B of the brace 62 under the cross member web is in generally closely spaced, parallel relation to the front flange 48 of the cross member 32. The first portion 62B is attached to the underside of the cross member web by a butt weld W9 extending along the upper edge of the side of the brace facing away from the front flange (FIG. 5). A foot 66 (broadly, "second portion") of the L-shaped brace 62 extends away from the first portion 62A and front flange 48 of the cross member 32 in generally perpendicular relation to the first portion and front flange. A weld W10 on the laterally inner side of the foot 66 further connects the brace 62 to the cross member 32. The foot 66, as welded to the cross member web 46, resists buckling of the brace 62. The connection of the brace 62 over substantially the entire length of the first and second portions of the brace underlying the cross member web 46 spreads out the area in which stress is applied to the cross member 32 so that there is more material resisting the applied stresses. In addition, essentially three flanges (the front flange 48, the back flange 50 and the brace 62) must fail for the cross member 32 to fail.

As shown in FIG. 6, it may be seen that the base 22 further includes a pair of support members indicated generally at 70. The support members are of inverted channel shape and lie at opposite sides of the base 22, extending forward above the bottom wall 24 from respective legs 30 to the front of the base. Each support member 70 has a pair of generally parallel, spaced-apart side walls 72 extending up from the bottom wall 24 of the base 22 and lying in planes extending in front-to-back direction with respect to the base, and a top wall 74 connecting the side walls. The side walls 72 of the support members 70 are each welded along their lower edges to the bottom wall 24 and welded to respective ones of the front flanges 36 of the legs 30 along a rear edge margin. The forwardmost lower edge margin portion of the laterally outer side wall 72 of the support member is attached by welding to a return 76 of a front wall 78 of the base 22. The top wall 74 of the support member 70 is welded to the corresponding front flange 36 of one of the legs 30.

To reinforce the rack 20, braces indicated generally at 82, which are completely separate from the support members 70, are attached to the base 22 adjacent opposite legs 30 of the rack. Each brace 82 has a generally vertical leg 84 which extends forward from generally adjacent the back wall 26 of the base 22, the rearward edge of the leg being spaced a small distance forward from the back wall 26. A top edge margin of the vertical leg 84 is formed to extend laterally inwardly from the top edge of the leg to define a cover support 86. The brace 82 is arranged so that its vertical leg 84 bridges a respective leg 30 and associated support member 70 of the rack 20. The vertical leg 84 is attached, as by welding, along its back edge and a portion of its top edge to a respective leg 30. A forward portion of the top edge is attached by welding to the support member 70. A forward edge of the vertical leg 84 is also attached by welding to the inner side wall 72 of the support member. At the bottom of the forward edge a portion (not shown) of the vertical leg 84 juts out under the return of the front wall of the base 22. The upper edge of the jutting out portion is also welded to the side wall 72 of the support member.

Each brace 82 also includes a generally horizontal leg 88 extending laterally from a lower edge of the vertical leg 84 and overlying the bottom wall 24 of the base 22. Openings 90 are provided in the horizontal leg 88 which are aligned with a corresponding fastener opening 28 in the bottom wall 24 of the base 22 so that fasteners can be driven through the aligned openings 28, 90 and into the surface supporting the rack 20 for securing the rack to the surface. The laterally inner edge of the horizontal leg 88 is attached by welds to the bottom wall 24.

As shown in FIGS. 6 and 7, the rack 20 includes a one-piece cover, generally indicated at 92, adapted to be removably fastened to the to base 22 in a position (FIG. 7) where the cover extends forward from the back wall 26 between the legs 30 and is spaced above the bottom wall 24 of the base. The cover 92 in combination with the bottom wall 24, back wall 26 and front wall 78 of the base 22 defines an enclosure for electrical wiring. It is to be understood that items other than electrical equipment may be mounted on the rack 20 without departing from the scope of the present invention. The cover 92 includes a top panel 94 which is cut out so that the top panel is received between the legs 30 and overlies the top walls 74 of the support members 70. The top panel 94 also rests on the cover supports 86 formed at the tops of the vertical legs of the braces and a return 96 of the back wall 26. A front panel of the cover 92, generally indicated at 96, is formed as one piece with the top panel 94 and extends downward from a forward edge of the top panel over the front of the base 22. The front panel has a first section 98 which is formed to fit against the front edges of the support members 70, and a second section 100 which is formed to fit around and rest on protruding portions of the laterally outer side walls 72 of the support members. A third section 102 of the front panel 96 extends inwardly and downwardly for abutting the front wall 78 of the base 22. The cover 92 may be formed by bending a piece of sheet metal, or in another suitable manner.

The cover 92 is secured to the base 22 using a single pair of fasteners 104, which are the sole fasteners connecting the cover to the base. The fasteners 104 fit through corresponding openings 106 in the cover 92 which are aligned with mating openings 108 in the front wall of the base 22 (FIG. 6). Thus, the entire interior of the base 22 can be exposed by removing the two fasteners 104 and lifting the cover 92 off of the base. Often racks of the type to which this invention relates are used in cramped quarters. The fewer parts to be manipulated for exposing the wiring carried in the base 22 of the rack 20, the easier it is for technicians who must work on the equipment.

A second embodiment of the rack 220 is shown in FIG. 8 to comprise a base 222 and legs 230 attached to the base and extending upwardly from the base. The rack 220 closely corresponds in many respects to the rack 20 of the first embodiment. Corresponding parts will be designated by the same reference numeral as their counterparts in the first embodiment, plus 200. The rack 220 has a cover for the base 222, which is not shown but substantially identical to the cover 92 of the first embodiment. The legs 230 of the rack 220 have a web 234, a front flange 236 and a back flange 238. The front and back flanges 236, 238 are essentially reversed from the front and back flanges 36, 38 of the legs 30 of the first embodiment. The front and back flanges 236, 238 have corresponding front and rear return flaps 240, 242 extending inwardly from the laterally outer edges of the flanges. A cross member 232 extends between and is connected to the webs 234 of the legs 230 by welding in the same manner described for the cross member 32 of the first embodiment.

A reinforcing strut 254 of the second embodiment is positioned against the back flange 238 of each leg 230. However, unlike the reinforcing strut 54 of the first embodiment, the strut extends substantially the full height of the leg. The stiffener 44 present in the first embodiment is not present in the second embodiment. It is to be understood that a reinforcing strut extending the full height of a leg may be used in the configuration of the rack 20 of the first embodiment. Likewise, a reinforcing strut extending less than the full height of a leg may be used in the configuration of the rack 220 of the second embodiment. The reinforcing strut 254 has a web 256 in spaced apart opposed relation with an interior face of the back flange 238, and a pair of opposed flanges 258 extending forwardly from opposite longitudinal edges of the web and into engagement with the interior face of the back flange. The reinforcing strut 254 is fixed to the leg by spot welds W11 spaced along the longitudinal edges of the web 256 and joining the strut to the web 234 of the leg 230 and the back return flap 242, respectively. Only the welds W11 connecting the reinforcing member 254 to the leg web 234 are illustrated in FIG. 8. As attached to the leg 230, the reinforcing strut 254 and back flange 238 of the leg define a box beam element to strengthen the back flange. The reinforcing strut 254 reinforces the back flange 238 to resist forces, such as those forces encountered by the rack during an earthquake, which tend to twist the material of the back flange about an axis perpendicular to the back flange and cause it to buckle and fail.

The cross member 232 is tied to each of the legs 230 by a brace 262 rigidly connected to the cross member and to the box beam element defined by the reinforcing strut 254 and back flange 238 of the leg. The brace 262 is substantially identical to the brace 62 of the first embodiment. The brace 262 extends from under the cross member web 246 through an opening 264 in the web 234 of the leg and across the web 256 of the reinforcing strut 254. Part of the brace 262 lies generally in face-to-face engagement with the web 256 of the reinforcing strut 254. The brace 262 is attached to the reinforcing strut 254 by welds (not shown, but substantially identical to welds W5, W6 of the first embodiment) extending across upper and lower edge segments of the part of the brace in registration with the reinforcing strut. The brace 262 is attached along the full length of its outer end by a weld (not shown, but substantially identical to weld W7) to the rear return flap 242 of the leg 230, and to the leg web 234 by a weld (not shown but substantially identical to weld W8) extending transversely across the brace.

A first portion of the brace 262 under the cross member web 234 is in generally closely spaced, parallel relation to the back flange 250 of the cross member 232. The brace 262 is attached to the underside of the cross member web 234 by a butt weld (not shown) extending along the side of the brace facing away from the back flange 250. A foot 266 (broadly, "second portion") of the L-shaped brace 262 extends away from the back flange 250 in generally perpendicular relation to the back flange. A weld (not shown, but substantially identical to weld W10) on the laterally inner side of the foot 266 further connects the brace 262 to the cross member 232. The foot 266, as welded to the cross member web 246, resists buckling of the brace 262. Thus it may be seen that the arrangement and mounting of the brace 262 is substantially the same as the brace 62 of the first embodiment except that the brace 262 is located nearer the back flanges 238, 250 of the leg 230 and cross member 232.

The several objects and features of the present invention are met by the racks 20, 220 of the preferred embodiments. The reinforcing struts 54, 254 turn the flanges of the legs into box beams, capable of resisting the stresses applied to the front or back flanges (e.g., front flange 48 and back flange 250) of the legs 30, 230, such as when the rack is violently shaken in an earthquake. The braces 62, 262 which tie the cross member 32, 232 to the legs spread out the area over which the stresses are applied to the cross member away from the corners of the cross member engaging the web 34, 234 of the leg. The location of the braces 62, 262 inwardly of the front and back flanges of the legs 230 and the cross members 32, 232 permits the front and back flanges of the cross member to be substantially co-planar with the front and back flanges of the legs. Accordingly, the rack 20, 220 may readily receive EMI shields (not shown) on the legs 30, 230 which will close the interior of the rack. The combination of the reinforcing struts 54, 254 and braces 62, 262 provides excellent resistance to failure caused by violent whipping of the legs during an earthquake. Moreover, the one-piece cover 62 provides for easy access to the wiring or other item located in the base.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A rack for electrical equipment comprising:
    a base having a front, a back and opposite sides; a pair of legs extending up from the base at opposite sides of the base, each leg being generally channel-shaped and having a web, a front flange projecting from a front edge of the web and a back flange projecting from a back edge of the web;
    a cross member extending between the webs of the legs generally at the upper ends of the legs, the cross member being rigidly connected to each leg thereby to interconnect the legs for strengthening the rack;
    a reinforcing strut rigidly mounted on each leg, each reinforcing strut having a web in spaced apart opposed relation with an interior face of one of the front and back flanges of the leg, said one flange and the reinforcing strut defining a box beam element strengthening said one flange;
    tie means for rigidly interconnecting the cross member to the box beam element.

2. A rack as set forth in claim 1 wherein the reinforcing strut further comprises a pair of opposed flanges extending from the web of the strut toward the interior face of said one flange of the leg.

3. A rack as set forth in claim 2 wherein the opposed flanges of the reinforcing strut engage the interior face of said one flange of the leg along longitudinal edges of the opposed flanges opposite the web of the reinforcing strut.

4. A rack as set forth in claim 3 wherein said one flange of the leg to which the reinforcing strut is rigidly mounted is the front flange.

5. A rack as set forth in claim 4 wherein the reinforcing strut is attached by welding to the leg.

6. A rack as set forth in claim 5 wherein the reinforcing strut extends less than the full length of said one flange.

7. A rack as set forth in claim 6 wherein the reinforcing strut is attached to the leg by continuous weld lines extending substantially the entire length of the reinforcing strut.

8. A rack as set forth in claim 7 wherein the leg further comprises a return flap extending from an edge of said one flange of the leg opposite the web, and wherein a first of the continuous weld lines joins the strut to the web of the leg, and a second of the weld lines joins the strut to the return flap of said one flange.

9. A rack as set forth in claim 5 wherein the reinforcing strut extends substantially the full length of said one flange of the leg.

10. A rack as set forth in claim 9 wherein the reinforcing strut is attached to the leg by spot welds.

11. A rack as set forth in claim 10 wherein the leg further comprises a return flap extending from an edge of said one flange of the leg opposite the web, and wherein the reinforcing strut is joined by spot welds spaced along its length to the web of the leg and to the return flap.

12. A rack as set forth in claim 5 wherein said tie means comprises a brace for each leg, each brace being rigidly connected to the cross member and to the box beam element of its corresponding leg.

13. A rack as set forth in claim 12 wherein the web of each leg has an opening therein, the brace extending through the opening generally transversely across the web of the reinforcing strut and being rigidly connected to the web of the reinforcing strut.

14. A rack as set forth in claim 13 wherein the cross member comprises a web, a front flange projecting from a front edge of the web and a back flange projecting from a back edge of the web, and wherein the brace is generally L-shaped and has two thin edges and opposed broad sides, one of the thin edges engaging the web of the cross member and one of the broad sides engaging the web of the reinforcing strut.

15. A rack as set forth in claim 14 wherein each brace includes a first portion in generally closely spaced, parallel relation to one of the front and back flanges of the cross member and a second portion in generally perpendicular arrangement to said one flange of the cross member, the brace being butt welded to the web of the cross member along the side of the first portion facing away from said one flange of the cross member and along the second portion.

16. A rack as set forth in claim 13 wherein the brace includes upper and lower edge segments generally in registration with the web of the reinforcing strut, the upper and lower edge segments being welded to the web of the reinforcing strut.

17. A rack as set forth in claim 16 wherein the brace is attached to the web of the leg by a weld extending transversely across the brace.

18. A rack as set forth in claim 17 wherein the brace is attached by welding to the return flap of said one flange.

19. A rack as set forth in claim 13 wherein the base comprises a bottom wall, and a back wall extending up from the bottom wall at the back of the rack, and wherein the rack further comprises a one-piece cover adapted to be removably fastened to the base of the rack in a position where the cover extends forward from the back wall of the base between the legs of the rack and is spaced above the bottom wall of the base to form, in combination with the back and bottom walls of the base, an enclosure, and fasteners for removably fastening the cover in fixed position on the base, said fasteners being adapted to be unfastened for removing the cover from the base thereby to provide ready access to an interior of the base.

20. A rack as set forth in claim 19 wherein the base further comprises a front wall extending upwardly from the bottom wall at the front of the base, the front wall having openings therein, the sole fasteners connecting the cover to the base being receivable through the cover and the openings in the front wall.

21. A rack as set forth in claim 13 wherein the front and back flanges of each leg lie generally in respective planes, no portion of the cross member extending forwardly from the plane of the front flange or rearwardly from the plane of the back flange.

22. A rack as set forth in claim 21 wherein the front flanges of each leg and the front flange of the cross member are substantially co-planar, and the back flanges of each leg and the back flange of the cross member are substantially co-planar.

23. A rack for electrical equipment comprising:
a base having a front, a back and opposite sides;
a pair of legs extending up from the base at opposite sides of the base, each leg being generally channel-shaped and having a web, a front flange projecting from a front edge of the web and a back flange projecting from a back edge of the web;
a cross member extending between the webs of the legs generally at the upper ends of the legs, the cross member being generally channel-shaped and having a web, a front flange protecting from a front edge of the web and a back flange projecting from a back edge of the web, the cross member being rigidly connected to each leg thereby to interconnect the legs for strengthening the rack;
a brace for each leg rigidly interconnecting the cross member to each leg, the brace having two thin edges and opposed broad sides, one of the thin edges engaging the web of the cross member, the web of each leg having an opening therein, the brace extending through the opening generally transversely over one of the front and back flanges of the leg and being rigidly connected to the leg, the brace including a first portion in generally closely spaced, parallel relation to one of the front and back flanges of the cross member and a second portion in generally non-parallel arrangement to said one flange of the cross member, the brace being butt welded to the web of the cross member along a side of the first portion facing away from said one flange of the cross member and along the second portion.

24. A rack as set forth in claim 23 wherein the brace is attached by welding to the leg.

25. A rack as set forth in claim 24 wherein the brace is generally L-shaped.

26. A rack as set forth in claim 25 further comprising a reinforcing strut rigidly mounted on each leg, each reinforcing strut having a web in spaced apart opposed relation with an interior face of one of the front and back flanges of the leg, said one flange and the reinforcing strut defining a box beam element strengthening said one flange.

27. A rack as set forth in claim 26 wherein the brace includes upper and lower edge segments generally in registration with the web of the reinforcing strut, the upper and lower edge segments being welded to the web of the reinforcing strut.

28. A rack as set forth in claim 27 wherein the brace is attached to the web of the leg by a weld extending transversely across the brace.

29. A rack as set forth in claim 28 wherein each leg comprises a return flap extending inwardly from an edge of said one flange of the leg opposite the web, the brace being attached by welding to the return flap of said one flange.

30. A rack as set forth in claim 23 wherein the base comprises a bottom wall, and a back wall extending up from the bottom wall at the back of the rack, and wherein the rack further comprises a one-piece cover adapted to be removably fastened to the base of the rack in a position where the cover extends forward from the back wall of the base between the legs of the rack and is spaced above the bottom wall of the base to form, in combination with the back and bottom walls of the base, an enclosure, and fasteners for removably fastening the cover in fixed position on the base, said fasteners being adapted to be unfastened for removing the cover from the base thereby to provide ready access to an interior of the base.

31. A rack as set forth in claim 30 wherein the base further comprises a front wall extending upwardly from the bottom wall at the front of the base, the front wall having openings therein, the sole fasteners connecting the cover to the base being receivable through the cover and the openings in the front wall.

32. A rack as set forth in claim 23 wherein the front and back flanges of each leg lie generally in respective planes, no portion of the cross member extending forwardly from the plane of the front flange or rearwardly from the plane of the back flange.

33. A rack as set forth in claim 32 wherein the front flange of each leg and the front flange of the cross member are substantially co-planar, and the back flange of each leg and the back flange of the cross member are substantially co-planar.

34. A rack for electrical equipment comprising:
a base having a front, a back and opposite sides, the base further including a bottom wall, and a back wall extending up from the bottom wall at the back of the rack;

a pair of legs extending up from the base at opposite sides of the base, each leg being generally channel-shaped and having a web, a front flange projecting from a front edge of the web and a back flange projecting from a back edge of the web;

a cross member extending between the webs of the legs generally at the upper ends of the legs, the cross member being generally channel-shaped and having a web, a front flange projecting from a front edge of the web and a back flange projecting from a back edge of the web, the cross member being rigidly connected to each leg thereby to interconnect the legs for strengthening the rack;

tie means for rigidly interconnecting the cross member to the legs;

a one-piece cover adapted to be removably fastened to the base of the rack in a position where the cover extends forward from the back wall of the base between the legs of the rack and is spaced above the bottom wall of the base to form, in combination with the back and bottom walls of the base, an enclosure;

fasteners for removably fastening the cover in fixed position on the base, said fasteners being adapted to be unfastened for removing the cover from the base thereby to provide ready access to an interior of the base.

35. A rack as set forth in claim 34 wherein the base further comprises a front wall extending upwardly from the bottom wall at the front of the base, the front wall having openings therein, the fasteners connecting the cover to the base being receivable through the cover and the openings in the front wall, and being the sole fasteners connecting the cover to the rack.

36. A rack as set forth in claim 34 further comprising a reinforcing strut rigidly mounted on each leg, each reinforcing strut having a web in spaced apart opposed relation with an interior face of one of the front and back flanges, and a pair of opposed flanges extending from the web of the strut toward the interior face of said one flange, said one flange and the reinforcing strut defining a box beam element strengthening said one flange.

37. A rack as set forth in claim 36 wherein said tie means comprises a brace for each leg rigidly interconnecting the cross member to each leg, the brace having two thin edges and opposed broad sides, one of the thin edges engaging the web of the cross member, the web of each leg having an opening therein, the brace extending through the opening generally transversely across the web of the reinforcing strut and being rigidly connected to the reinforcing strut, the brace including a first portion in generally closely spaced, parallel relation to one of the front and back flanges of the cross member and a second portion in generally non-parallel arrangement to said one flange of the cross member, the brace being butt welded to the web of the cross member along a side of the first portion facing away from said one flange of the cross member, and along the second portion.

38. A rack as set forth in claim 34 wherein the front and back flanges of each leg lie generally respective planes, no portion of the cross member extending forwardly from the plane of the front flange or rearwardly from the plane of the back flange.

39. A rack as set forth in claim 38 wherein the front flange of each leg and the front flange of the cross member are substantially co-planar, and the back flange of each leg and the back flange of the cross member are substantially co-planar.

\* \* \* \* \*